United States Patent
Akiyama (10) Patent No.: US 10,897,036 B2
(45) Date of Patent: Jan. 19, 2021

(54) METHOD OF PRODUCING GRANULAR AGGREGATE, METHOD OF PRODUCING ELECTRODE PLATE, AND METHOD OF PRODUCING BATTERY

(71) Applicant: TOYOTA JIDOSHA KABUSHIKI KAISHA, Toyota (JP)

(72) Inventor: Naohisa Akiyama, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 137 days.

(21) Appl. No.: 15/808,129

(22) Filed: Nov. 9, 2017

(65) Prior Publication Data
US 2018/0145309 A1 May 24, 2018

(30) Foreign Application Priority Data
Nov. 21, 2016 (JP) .................. 2016-225891

(51) Int. Cl.
*H01M 4/04* (2006.01)
*B01F 15/00* (2006.01)
(Continued)

(52) U.S. Cl.
CPC ......... *H01M 4/0404* (2013.01); *B01F 3/1214* (2013.01); *B01F 3/1221* (2013.01);
(Continued)

(58) Field of Classification Search
CPC .......... B01F 15/00253; B01F 15/00389; B01F 3/1214; B01F 3/1221; B01F 7/00208;
(Continued)

(56) References Cited

U.S. PATENT DOCUMENTS

2005/0064096 A1* 3/2005 Kurihara ............... B05B 13/025
427/215
2009/0267028 A1* 10/2009 Hoshiba ................. H01G 11/38
252/500
(Continued)

FOREIGN PATENT DOCUMENTS

JP 2007-299668 A 11/2007
JP 2010114030 A 5/2010
(Continued)

OTHER PUBLICATIONS

Machine Translation JP2010114030A (Year: 2010).*
(Continued)

*Primary Examiner* — Victoria H Lynch
(74) *Attorney, Agent, or Firm* — Sughrue Mion, PLLC (57) ABSTRACT

A method of producing a granular aggregate in which wet granulated substances including active material particles, conductive material particles, a binding agent for binding the active material particles and the conductive material particles, and a solvent are aggregated includes adding a binding agent solution in which the binding agent is dissolved in the solvent to the active material particles having a solvent absorbing property, mixing the binding agent solution and the active material particles such that a primary granular aggregate in which granulated primary granulated substances are aggregated is produced, and mixing the conductive material particles into the primary granular aggregate and producing a granulated granular aggregate.

5 Claims, 9 Drawing Sheets

(51) Int. Cl.
*B01F 3/12* (2006.01)
*B01F 7/00* (2006.01)
*B01F 7/16* (2006.01)
*C23C 14/58* (2006.01)
*H01M 2/36* (2006.01)
*H01M 4/36* (2006.01)
*H01M 10/04* (2006.01)

(52) U.S. Cl.
CPC ...... *B01F 7/00208* (2013.01); *B01F 7/00275* (2013.01); *B01F 7/00608* (2013.01); *B01F 7/00633* (2013.01); *B01F 7/166* (2013.01); *B01F 15/00253* (2013.01); *B01F 15/00389* (2013.01); *C23C 14/58* (2013.01); *H01M 2/365* (2013.01); *H01M 4/364* (2013.01); *H01M 10/049* (2013.01)

(58) Field of Classification Search
CPC .............. B01F 7/00275; B01F 7/00608; B01F 7/00633; B01F 7/166; C23C 14/58; H01M 10/049; H01M 2/365; H01M 4/0404; H01M 4/364
See application file for complete search history.

(56) References Cited

U.S. PATENT DOCUMENTS

| | | | |
|---|---|---|---|
| 2010/0075023 A1* | 3/2010 | Emoto | H01M 4/0404 427/58 |
| 2011/0039160 A1 | 2/2011 | Takahata et al. | |
| 2012/0282525 A1 | 11/2012 | Nagai et al. | |
| 2016/0211504 A1 | 7/2016 | Uezono et al. | |

FOREIGN PATENT DOCUMENTS

| | | |
|---|---|---|
| JP | 2011-119092 A | 6/2011 |
| JP | 2013-140714 A | 7/2013 |
| JP | 2014-192071 A | 10/2014 |
| JP | 2016-103433 A | 6/2016 |
| JP | 2016-134269 A | 7/2016 |
| WO | 2009/128410 A1 | 10/2009 |
| WO | 2015/041184 A1 | 3/2015 |

OTHER PUBLICATIONS

Partial English Translation of Notice of Reasons for Refusal dated Jan. 7, 2020, issued by the JPO in application No. JP2016-225891.

* cited by examiner

METHOD OF PRODUCING GRANULAR AGGREGATE, METHOD OF PRODUCING ELECTRODE PLATE, AND METHOD OF PRODUCING BATTERY

INCORPORATION BY REFERENCE

The disclosure of Japanese Patent Application No. 2016-225891 filed on Nov. 21, 2016 including the specification, drawings and abstract is incorporated herein by reference in its entirety.

BACKGROUND

1. Technical Field

The present disclosure relates to a method of producing a granular aggregate in which wet granulated substances which includes active material particles and conductive material particles and are granulated and wet are aggregated, a method of producing an electrode plate using a granular aggregate, and a method of producing a battery using an electrode plate.

2. Description of Related Art

When electrode plates (a positive electrode plate and a negative electrode plate) of a battery are produced, first, a granular aggregate (wet granulated particles and wet granulated substances) in which wet granulated substances including active material particles, conductive materials, and a binding agent are aggregated is produced. Then, the granular aggregate is transferred to a current collecting plate in a layer form using a roll press device including three rollers, drying is performed, and an electrode plate including an active material layer on the current collecting plate is obtained. This method is known in Japanese Unexamined Patent Application Publication No. 2016-103433 (JP 2016-103433 A) and Japanese Unexamined Patent Application Publication No. 2016-134269 (JP 2016-134269 A).

SUMMARY

However, it has been found that, transferability of the granular aggregate to the current collecting plate changes according to whether a long or short time elapses from when a granular aggregate is produced until it is transferred to a current collecting plate, that is, a change in transferability of the granular aggregate occurs over time. For example, a binding agent solution in which a binding agent (PVDF (polyvinylidene fluoride)) is dissolved in a solvent (NMP (N-methyl-2-pyrrolidone)) may be added to a mixture in which active material particles and conductive material particles are mixed in the dry state using a stirring type mixing and granulating device, mixing may be performed, and a granulated granular aggregate may be produced. Then, the granular aggregate may be transferred to the current collecting plate using a roll press device. In this case, it has been found that, when a time from when the granular aggregate is produced until it is transferred to the current collecting plate is long, transfer problems such as cracks (a defective portion of an undried active material layer which can be formed in a hole shape) and streaks (a defective portion of an undried active material layer which can be formed in a streak shape in a travelling direction of the current collecting plate) are likely to occur in the undried active material layer to which the granular aggregate is transferred.

The reason for this is inferred to be as follows. When time elapses after the granular aggregate has been produced, a distribution of the solvent in the granulated substance changes. That is, the active material particles and the conductive material particles mixed in the dry state are thought to be in a state in which a large number of small conductive material particles surround the active material particles. Since the active material particles surrounded by the conductive material particles and the binding agent solution are mixed and granulation is performed, when time elapses, the solvent in the binding agent solution passes through gaps between the conductive material particles, and gradually penetrates and is absorbed between the active material particles and the conductive material particles and further into the active material particles. On the other hand, when the granular aggregate is transferred to the current collecting plate, the active material particles surrounded by the conductive material particles are relatively moved. Therefore, the entire granular aggregate is deformed. However, as described above, since the solvent is absorbed, when a time has elapsed from granulation, an amount of solvent contributing to lubrication between the active material particles is reduced. That is, it is conceivable that, when a time has elapsed from granulation, spreadability of the granular aggregate is reduced, it is difficult to transfer the granular aggregate to the current collecting plate, and transfer problems such as cracks and streaks described above are likely to occur.

The present disclosure provides a method of producing a granular aggregate through which hardly any change in transferability occurs even if a time has elapsed from when a granular aggregate in which wet granulated substances including active material particles, conductive material particles, and a binding agent are aggregated is produced until it is transferred to a current collecting plate. In addition, the present disclosure provides a method of producing an electrode plate using the granular aggregate produced in this manner and a method of producing a battery using the electrode plate produced in this manner.

A first aspect of the present disclosure relates to a method of producing a granular aggregate in which wet granulated substances including active material particles, conductive material particles, a binding agent for binding the active material particles and the conductive material particles, and a solvent are aggregated. The method of producing a granular aggregate includes adding a binding agent solution in which the binding agent is dissolved in the solvent to the active material particles having a solvent absorbing property, mixing the binding agent solution and the active material particles such that a primary granular aggregate in which granulated primary granulated substances are aggregated is produced, and mixing the conductive material particles into the primary granular aggregate such that the granulated granular aggregate is produced.

In the method of producing a granular aggregate, after the active material particles are mixed into the binding agent solution and the primary granular aggregate is produced, conductive material particles are mixed thereinto, secondary granulation is performed, and a granular aggregate is produced. In the granular aggregate produced in this manner, since the solvent penetrates the active material particles in advance, a change in spreadability over time after production is small, and a change in transferability over time is small. Thus, if the granular aggregate produced according to the production method is used, when the granular aggregate is transferred to the current collecting plate to form the electrode plate, it is possible to stably form the undried active material layer on the current collecting plate without an influence due to elapse of time from when the granular aggregate is produced until it is transferred, and the occurrence of cracks and streaks described above is prevented.

Here, as the active material particles having a solvent absorbing property, positive electrode active material particles and negative electrode active material particles having a solvent absorbing property which is a property of absorbing a solvent may be exemplified. As the positive electrode active material particles having a solvent absorbing property, porous active material particles which are formed by aggregating primary particles made of a positive electrode active material and have pores between the primary particles, for example, porous positive electrode active material particles in which primary particles are aggregated in an amorphous form and hollow porous positive electrode active material particles in which primary particles are aggregated in a shell shape (for example, refer to Japanese Unexamined Patent Application Publication No. 2011-119092 (JP 2011-119092 A)) may be exemplified. In addition, as the negative electrode active material particles having a solvent absorbing property, graphite particles having unevennesses on their surfaces such as scaly graphite and spherical graphite may be exemplified.

As the conductive material particles, carbon black such as acetylene black and furnace black may be exemplified. As the conductive material particles, particles having a smaller particle size than the active material particles may be used. As the binding agent, according to a solvent and active material particles to be used, a resin such as PVDF (polyvinylidene fluoride), synthetic rubber such as SBR, a thickener such as CMC (carboxymethyl cellulose), and the like may be used. As the solvent, an organic solvent such as NMP (N-methyl-2-pyrrolidone) and water may be exemplified. For example, using a stirring type mixing and granulating device including stirring blades, mixing and granulation may be performed by rotating the stirring blades.

The active material particles may be porous active material particles formed by aggregation of primary particles made of an active material.

In the production method, as the active material particles, porous active material particles into which a solvent is likely to be absorbed are used. Before a granular aggregate is produced, the porous active material particles and the binding agent solution are mixed, and granulation is performed. Therefore, the solvent in the binding agent solution is quickly absorbed into the porous active material particles. A stabilized relationship is established for the solvent between the active material particles and the binding agent. Then, the conductive material particles are added and a granular aggregate is produced according to secondary granulation. Thus, due to absorption of the solvent into the porous active material particles over time, a change in spreadability of the granular aggregate over time is reduced and it is possible to stably transfer the granular aggregate to the current collecting plate to form the active material layer.

Here, as the porous active material particles, active material particles in which primary particles are aggregated in an amorphous form and hollow porous active material particles in which primary particles are aggregated in a shell shape may be exemplified.

The active material particles may be porous positive electrode active material particles made of a lithium-containing positive electrode active material. The conductive material particles may be acetylene black. The binding agent may be polyvinylidene fluoride (PVDF). The solvent may be N-methyl-2-pyrrolidone (NMP).

In the production method, for example, the materials described above are used. Thus, due to absorption of the solvent into the porous positive electrode active material particles over time, a change in spreadability of the granular aggregate over time is reduced and it is possible to stably transfer the positive electrode granular aggregate to the current collecting plate to form a favorable positive electrode active material layer.

A second aspect of the present disclosure relates to a method of producing an electrode plate including a current collecting plate and an active material layer. The method of producing an electrode plate includes transferring the granular aggregate produced by the method according to any one of the above descriptions to the current collecting plate such that an undried active material layer is formed, and drying the formed undried active material layer.

In the method of producing an electrode plate, the granular aggregate described above is transferred to the current collecting plate, drying is performed, and an electrode plate including the active material layer is produced. Thus, since a change in transferability of the granular aggregate over time is small and elapse of time from when the granular aggregate is produced until it is transferred has hardly any influence, it is possible to prevent the occurrence of defects such as cracks and streaks, and it is possible to stably form the undried active material layer. Therefore, it is possible to obtain an electrode plate including an active material layer having uniform quality.

A third aspect of the present disclosure relates to a method of producing a battery. The method includes forming an electrode body including the electrode plate produced in the method according to the second aspect, accommodating the electrode body in a battery container, injecting an electrolyte solution into the battery container, and sealing the battery container.

In the method of producing a battery, an electrode plate including an active material layer obtained by transferring the granular aggregate described above to the current collecting plate and performing drying is used. Thus, an electrode plate having stable characteristics can be used, and a battery having stable characteristics can be obtained.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Embodiments of the present disclosure will be described below with reference to the drawings. First, a positive electrode granular aggregate (hereinafter simply referred to as an aggregate) 1 produced by a production method of the present embodiment will be described. The positive electrode granular aggregate 1 is made of a wet positive electrode wet granulated substance which includes a plurality of positive electrode active material particles 2, a plurality of conductive material particles 3, a binding agent 4, and a solvent 5, and which is granulated to a particle size of several tens of μm to several mm. Here, in the present embodiment, as the positive electrode active material particles 2, porous lithium transition metal composite oxide particles in which primary particles of a positive electrode active material are aggregated in an amorphous form, specifically, lithium nickel cobalt manganese oxide particles are used. In addition, acetylene black (AB) particles are used as the conductive material particles 3, PVDF is used as the binding agent 4, and NMP is used as the solvent 5. In the aggregate 1 of the present embodiment, a solid fraction is 78.0 wt %, and the proportion of NMP is 22.0 wt %. Further, as proportions of solid components (the positive electrode active material particles 2, AB particles 3, and PVDF 4), the proportion of the positive electrode active material particles 2 is 94.4 wt %, the proportion of the AB particles 3 is 4.1 wt %, and the proportion of PVDF 4 is 1.5 wt % when the entire solid component is set to 100 wt %.

Figure 1:
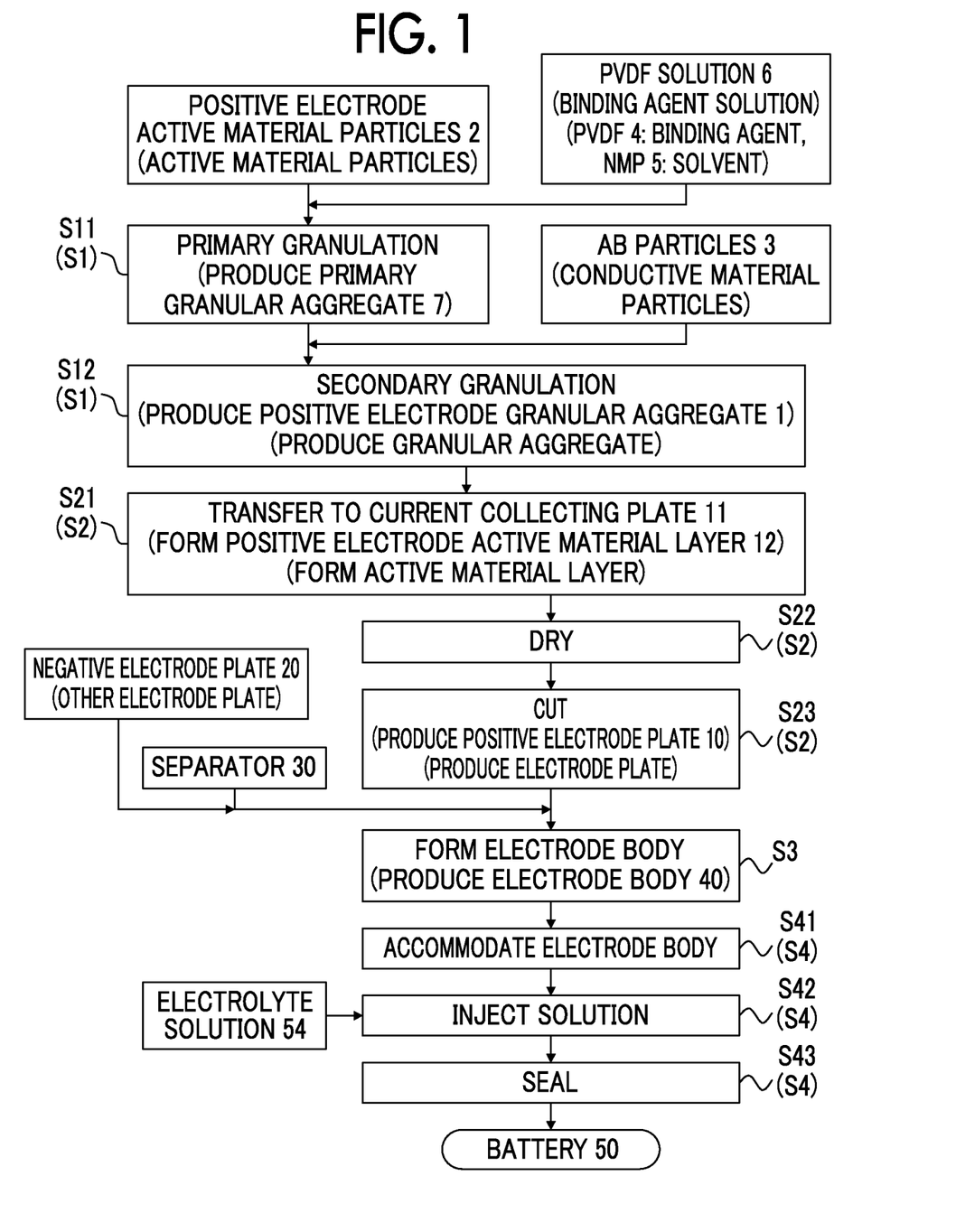
FIG. 1 is a flowchart showing procedures of producing a positive electrode granular aggregate, producing a positive electrode plate, and producing a battery according to an embodiment.
Figure 2:
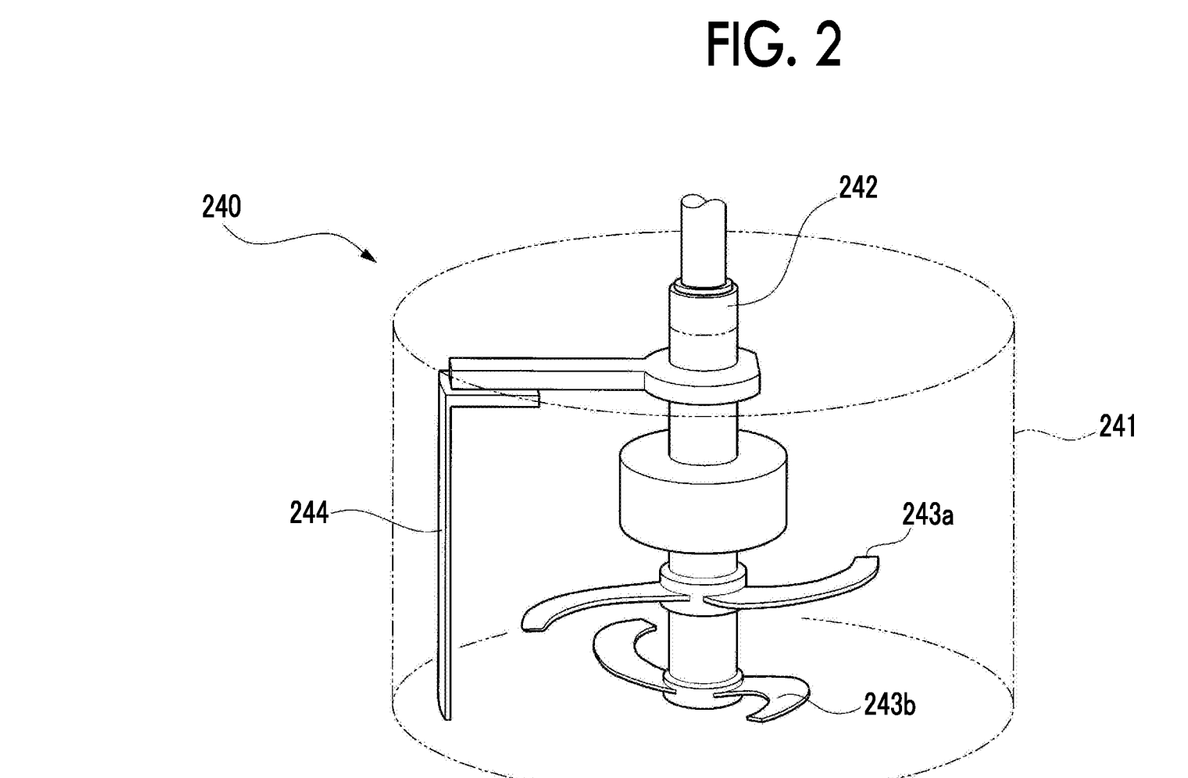
FIG. 2 is an explanatory diagram showing a form of a stirring type mixing and granulating device.

FIG. 1 shows procedures (granulated substance producing process S1) of producing the aggregate 1 according to the present embodiment. The aggregate 1 is produced by the following method (refer to FIG. 1). That is, a stirring type mixing and granulating device 240 (refer to FIG. 2) which includes stirring blades and is capable of mixing and granulating materials is prepared. In the present embodiment, an automatic granulator commercially available from RIX Corporation is used. In the stirring type mixing and granulating device 240, a rotation shaft 242 is provided at the center of a cylindrical container 241 with a bottom that is closed, and stirring blades 243a and 243b which have substantially a semicircular arc shape and rotate in opposite directions are attached to a lower part of the rotation shaft 242. In addition, a scraper 244 configured to scrape off powder and the like adhered to a side surface of the container 241 rotates along the side surface of the container 241. Thus, when powder and a solvent are put into the container 241 of the stirring type mixing and granulating device 240, and the rotation shaft 242 and the stirring blades 243a and 243b rotate at a high speed, the solvent can be dispersed into various parts of the powder, and further, an aggregate of a granulated substance in which the powder is wetted with the solvent can be produced.

In the present embodiment, in advance, in addition to the positive electrode active material particles 2, a PVDF solution (binding agent solution) 6 in which PVDF 4 is dissolved in NMP 5 is prepared. First, in a primary granulation process (Step S11) within the granulated substance producing process S1, the positive electrode active material particles (lithium transition metal composite oxide particles) 2 and the PVDF solution 6 are put into the stirring type mixing and granulating device 240, and the stirring blades 243a and 243b are rotated at a rotational speed of 800 rpm for 10 seconds to perform primary granulation. Thus, a primary granular aggregate 7 in which wet primary granulated substances including the positive electrode active material particles 2 and the PVDF (binding agent) 4 are aggregated is produced.

Subsequently, in a secondary granulation process (Step S12) within the granulated substance producing process S1, the AB particles (conductive material particles) 3 are put into the stirring type mixing and granulating device 240, the stirring blades 243a and 243b are rotated at a rotational speed of 800 rpm for 10 seconds, the primary granular aggregate 7 and the AB particles 3 are mixed, the stirring blades 243a and 243b are then rotated again at a rotational speed of 1200 rpm for 5 seconds, and thus the positive electrode granular aggregate 1 is obtained. The positive electrode granular aggregate 1 is an aggregation of granular positive electrode granulated substances (wet granulated substances) including the positive electrode active material particles 2, the AB particles 3, PVDF 4, and NMP 5 described above.

Subsequently, the positive electrode granular aggregate 1 obtained according to the production method described above is used to produce (a positive electrode plate producing process S2) a positive electrode plate 10 of a lithium ion secondary battery 50. Specifically, a roll press device 250 which includes a first roller 251, a second roller 252 disposed parallel to the first roller 251 with a first gap KG1 therebetween, and a third roller 253 disposed parallel to the second roller 252 with a second gap KG2 therebetween is prepared. Motors (not shown) for rotating and driving rollers are connected to the first to third rollers 251, 252, and 253, and the motors are controlled by a control unit (not shown). In addition, above the first gap KG1 between the first roller 251 and the second roller 252, a supply unit 254 configured to store the aggregate 1 and supply it to the first gap KG1 is provided. The first to third rollers 251, 252, and 253 of the roll press device 250 are rotated in rotation directions indicated by arrows in FIG. 3. That is, the first roller 251 and the third roller 253 are rotated in the same rotation direction (clockwise in the present embodiment), and the second roller 252 is rotated in a direction (counterclockwise in the present embodiment) opposite thereto.

Figure 3:
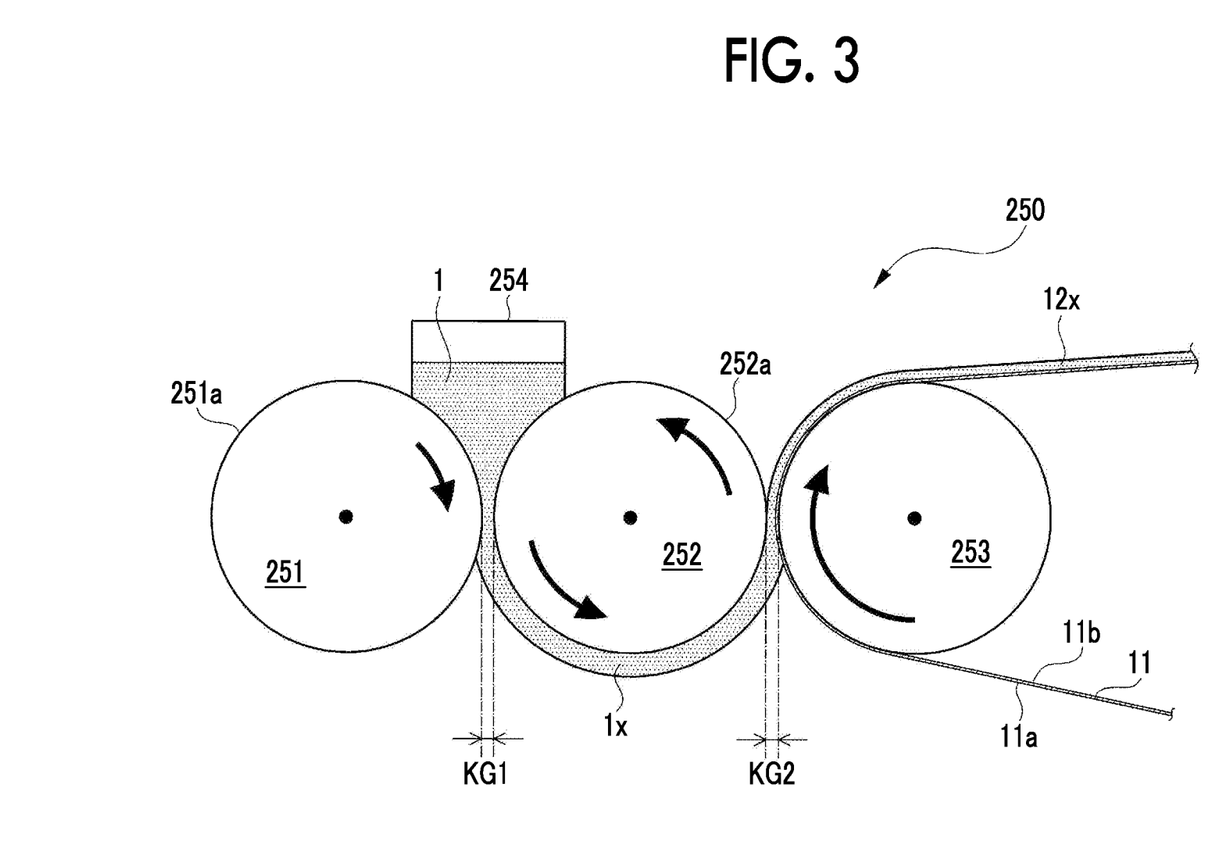
FIG. 3 is an explanatory diagram showing a state in which a positive electrode granular aggregate is transferred to a positive electrode current collecting plate using a roll press device according to an embodiment.

Then, within the positive electrode plate producing process S2, first, in a transfer process S21, the aggregate 1 described above is put into the supply unit 254 of the roll press device 250, the aggregate 1 is consolidated between the first roller 251 and the second roller 252, and an undried film 1x is formed on a second roller surface 252a. Subsequently, between the second roller 252 and the third roller 253, the undried film 1x held on the second roller surface 252a is transferred onto a main surface 11a of a positive electrode current collecting plate 11 conveyed by the third roller 253, and an undried positive electrode active material layer 12x is formed.

Then, the undried positive electrode active material layer 12x on the positive electrode current collecting plate 11 is dried and a positive electrode active material layer 12 is formed (a drying process S22). Here, in order to provide the positive electrode active material layer 12 on both surfaces of the positive electrode current collecting plate 11, the transfer process S21 and the drying process S22 described above are performed on the other main surface 11b of the positive electrode current collecting plate 11. Then, cutting into a desired size is performed and the positive electrode plate 10 is obtained (refer to FIG. 4).

Figure 4:
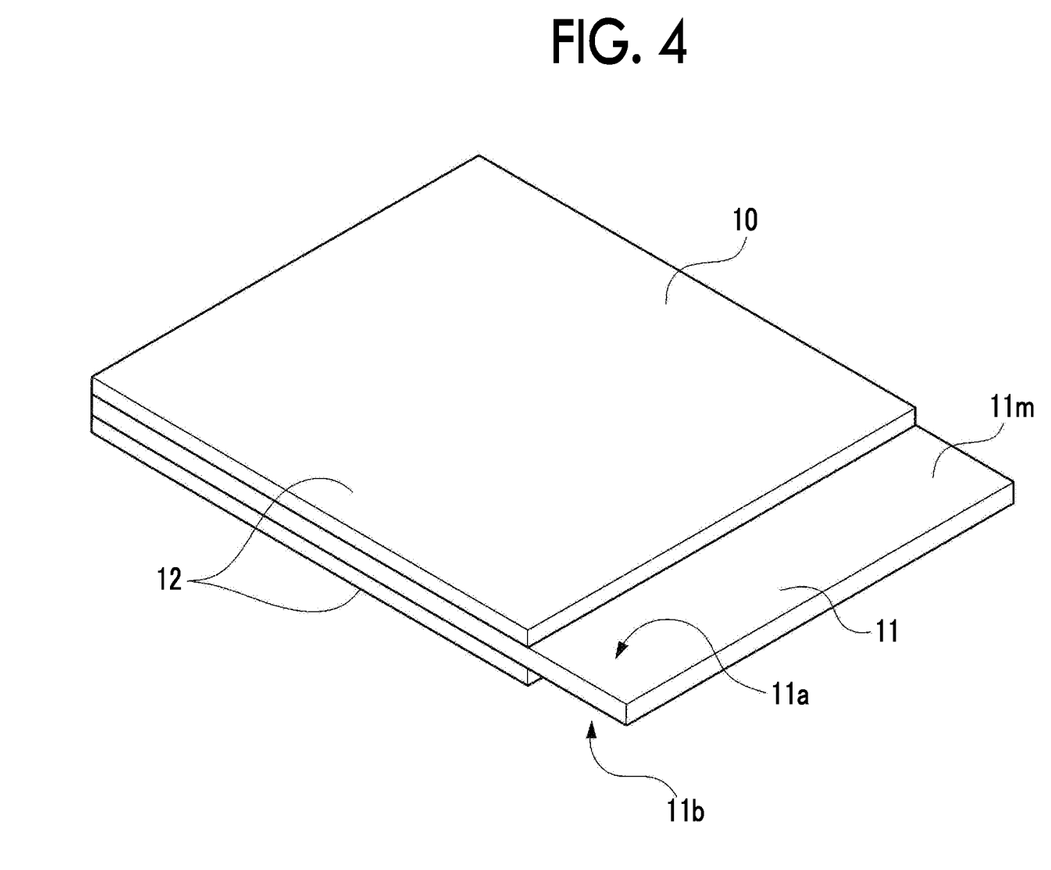
FIG. 4 is a perspective view of a positive electrode plate having a positive electrode active material layer on a positive electrode current collecting plate according to an embodiment.

The positive electrode plate 10 includes the positive electrode active material layers 12 on both of the main surfaces 11a and 11b of the rectangular positive electrode current collecting plate 11, and a positive electrode current collecting part 11m in which the positive electrode current collecting plate 11 is exposed in a rectangular shape along one side of the positive electrode current collecting plate 11 is also provided.

In the present embodiment, after 12 hours have elapsed from when the positive electrode granular aggregate 1 produced in the method in the granulated substance producing process S1 described above has been obtained, even if the undried positive electrode active material layer 12x is formed on the positive electrode current collecting plate 11 by the roll press device 250 (Step S21), no cracks and streaks are generated in the undried positive electrode active material layer 12x. That is, transferability of the aggregate 1 hardly changes over time, and as in when the transfer process S21 is performed immediately after the positive electrode granular aggregate 1 is obtained, it is possible to form the undried positive electrode active material layer 12x.

Figure 5:
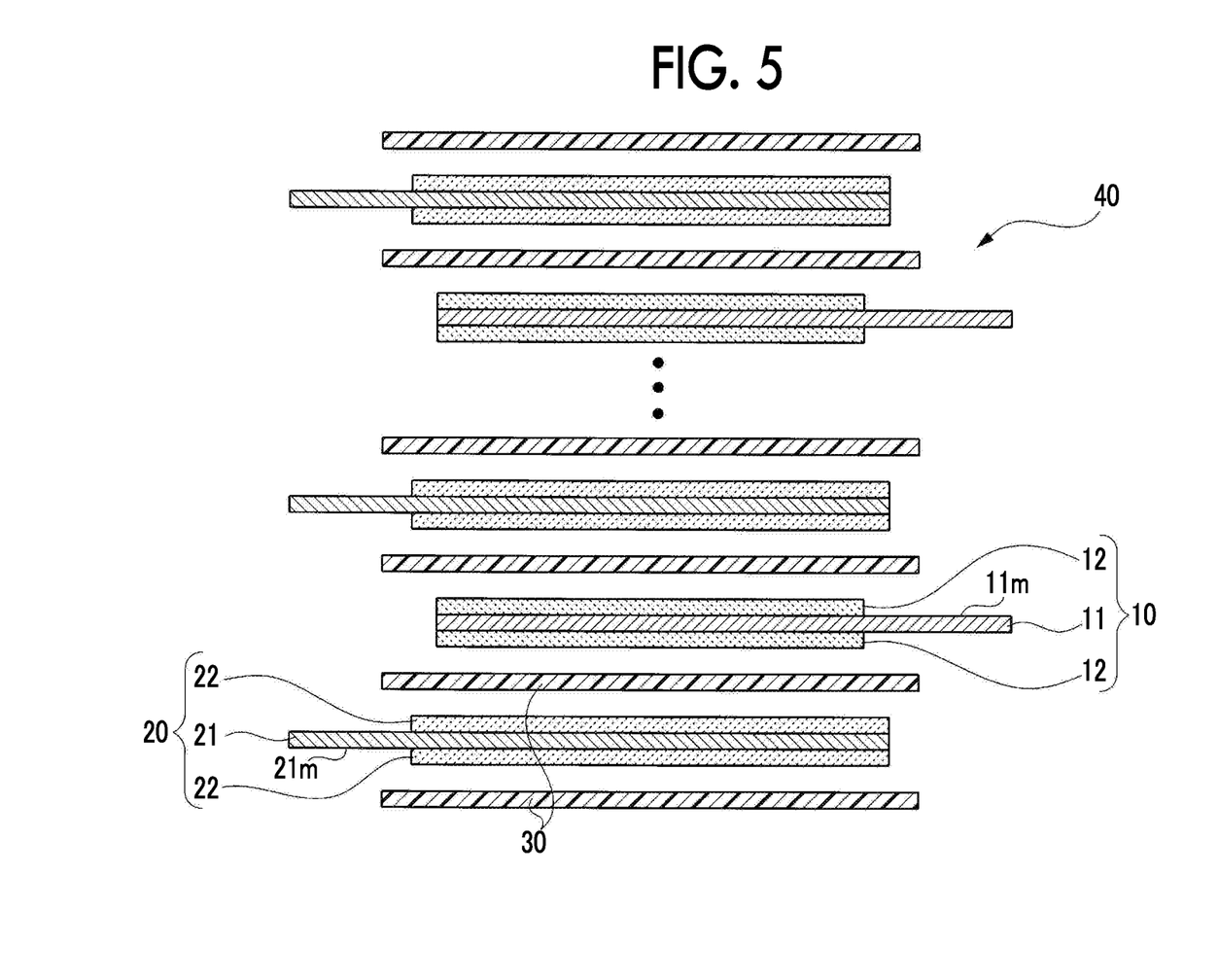
FIG. 5 is a longitudinal section view of an electrode body using a positive electrode plate according to an embodiment.

Next, in the present embodiment, in an electrode body forming process S3, an electrode body 40 is formed using the positive electrode plate 10, a separator, and a negative electrode plate 20. Specifically, as shown in FIG. 5, the positive electrode plate 10 and the negative electrode plate 20 are alternately laminated with a separator 30 therebetween to form the laminate electrode body 40. Here, the negative electrode plate 20 includes negative electrode active material layers 22 on both main surfaces of a rectangular negative electrode current collecting plate 21, and the negative electrode current collecting plate 21 exposed in a rectangular shape along one side of the negative electrode current collecting plate 21 forms a negative electrode current collecting part 21m. In the electrode body 40 of the present embodiment, the positive electrode current collecting part 11m of the positive electrode plate 10 and the negative electrode current collecting part 21m of the negative electrode plate 20 are laminated in a form in which they are positioned in directions opposite to each other.

Figure 6:
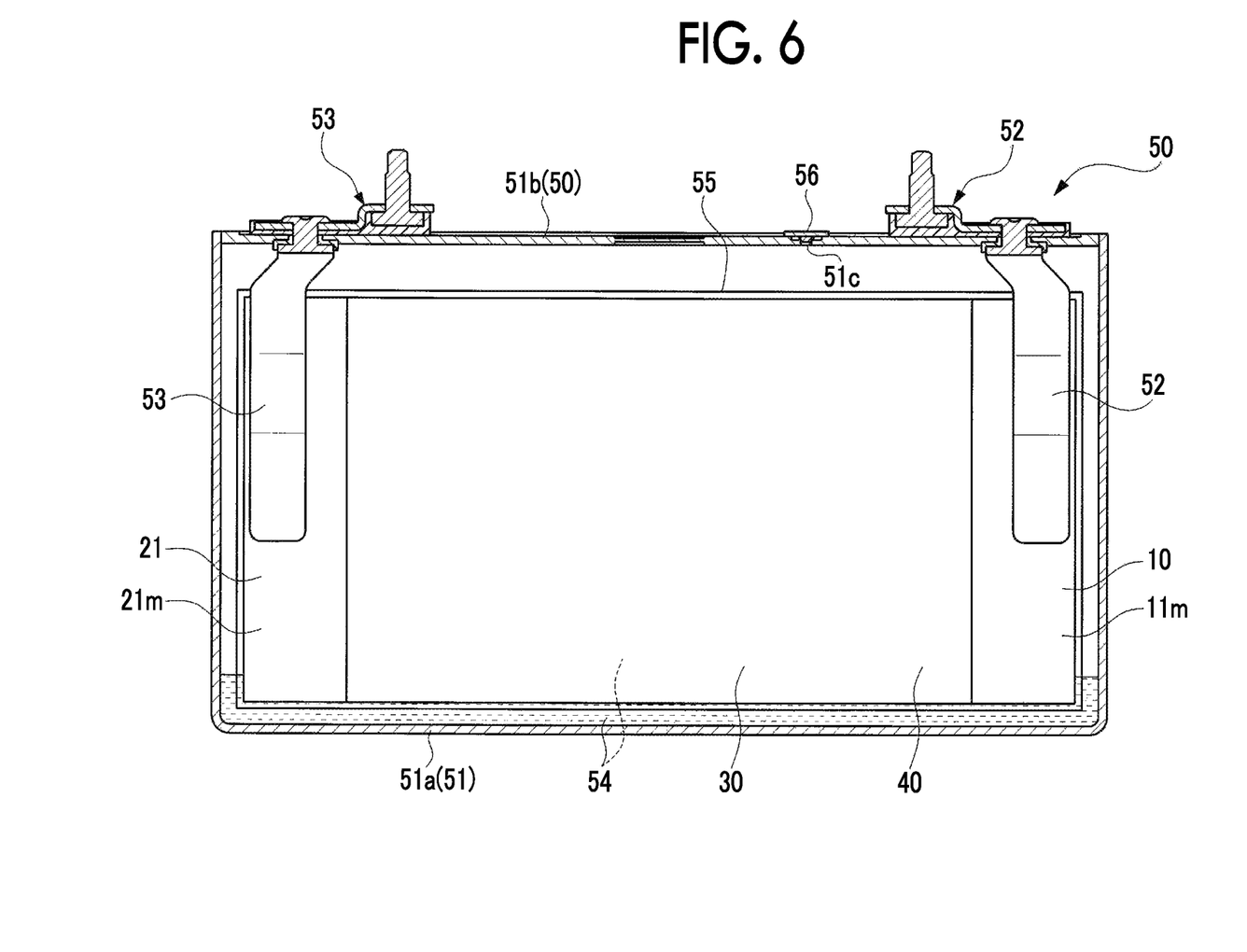
FIG. 6 is a longitudinal section view of a battery according to an embodiment.

Further, in the present embodiment, in a battery producing process S4, the lithium ion secondary battery (hereinafter simply referred to as a battery) 50 shown in FIG. 6 is produced using the electrode body 40. The battery 50 is a rectangular and closed type lithium ion secondary battery mounted in a vehicle such as a plug-in hybrid vehicle, an electric vehicle, or the like. The battery 50 includes a battery case 51, the above electrode body 40 accommodated therein, a positive electrode terminal member 52 and a negative electrode terminal member 53 supported by the battery case 51, and the like. In addition, in the battery case 51, an electrolyte solution 54 is accommodated, and a part thereof is impregnated into the electrode body 40.

Here, the battery case 51 has a rectangular parallelepiped box shape and is made of a metal (aluminum in the present embodiment). The battery case 51 includes a case body member 51a of which only an upper side is open and which has a rectangular tubular shape with a bottom and a rectangular plate-like case lid member 51b which is welded while the opening of the case body member 51a is closed. In the case lid member 51b, the positive electrode terminal member 52 made of aluminum which is insulated from the case lid member 51b is fixed. The positive electrode terminal member 52 is electrically connected to the positive electrode current collecting part 11m of the positive electrode plate 10 within the electrode body 40 in the battery case 51 and penetrates the case lid member 51b and extends to the outside of the battery. In addition, in the case lid member 51b, the negative electrode terminal member 53 made of copper which is insulated from the case lid member 51b is fixed. The negative electrode terminal member 53 is electrically connected to the negative electrode current collecting part 21m of the negative electrode plate 20 within the electrode body 40 in the battery case 51 and penetrates the case lid member 51b and extends to the outside of the battery.

The electrode body 40 (refer to FIG. 5) described above is accommodated in the battery case 51. Between the electrode body 40 and the battery case 51, a bag-like insulating film enclosure 55 which accommodates the electrode body 40 and is made of an insulating film is disposed. Within the electrode body 40, the positive electrode current collecting parts 11m of the positive electrode plates 10 are bundled in a thickness direction and welded to the positive electrode terminal member 52. In the same manner, the negative electrode current collecting parts 21m of the negative electrode plates 20 are bundled in a thickness direction and welded to the negative electrode terminal member 53.

A method (the battery producing process S4) of producing the battery 50 will be described (refer to FIG. 6). In advance, the case lid member 51b is prepared, and the positive electrode terminal member 52 and the negative electrode terminal member 53 are fixed thereto. First, in an accommodating process S41, the positive electrode terminal member 52 and the negative electrode terminal member 53 are welded to the positive electrode current collecting part 11m of the positive electrode plate 10 and the negative electrode current collecting part 21m of the negative electrode plate 20 of the electrode body 40, respectively. Next, the electrode body 40 that is covered with the insulating film enclosure 55 is inserted into the case body member 51a. Then, the opening of the case body member 51a is closed with the case lid member 51b, and the case body member 51a and the case lid member 51b are welded to form the battery case 51. Thus, the electrode body 40 is accommodated in the battery case 51.

Next, the electrolyte solution 54 is injected into the battery case 51 from an injection hole 51c and is impregnated into the electrode body 40 (injection process S42). Then, the injection hole 51c is sealed with a sealing member 56 (sealing process S43). Thus, the battery 50 is completed.

Examples 1 to 3

Next, positive electrode granular aggregates 1 were obtained according to the method of the embodiment described above (Examples 1 to 3) and positive electrode granular aggregates were obtained according to a method different from that of the embodiment (Comparative Examples 1 to 3). Differences in changes in spreadability and transferability over time of the positive electrode granular aggregates were evaluated. The aggregates 1 of Examples 1 to 3 were obtained according to the method according to the embodiment described above. However, a solid fraction NV of the aggregate 1 was set to 80 wt % in Example 1, 78 wt % in Example 2, and 76 wt % in Example 3. Here, the aggregate 1 of the embodiment described above corresponds to Example 2.

Comparative Examples 1 to 3

Figure 9:
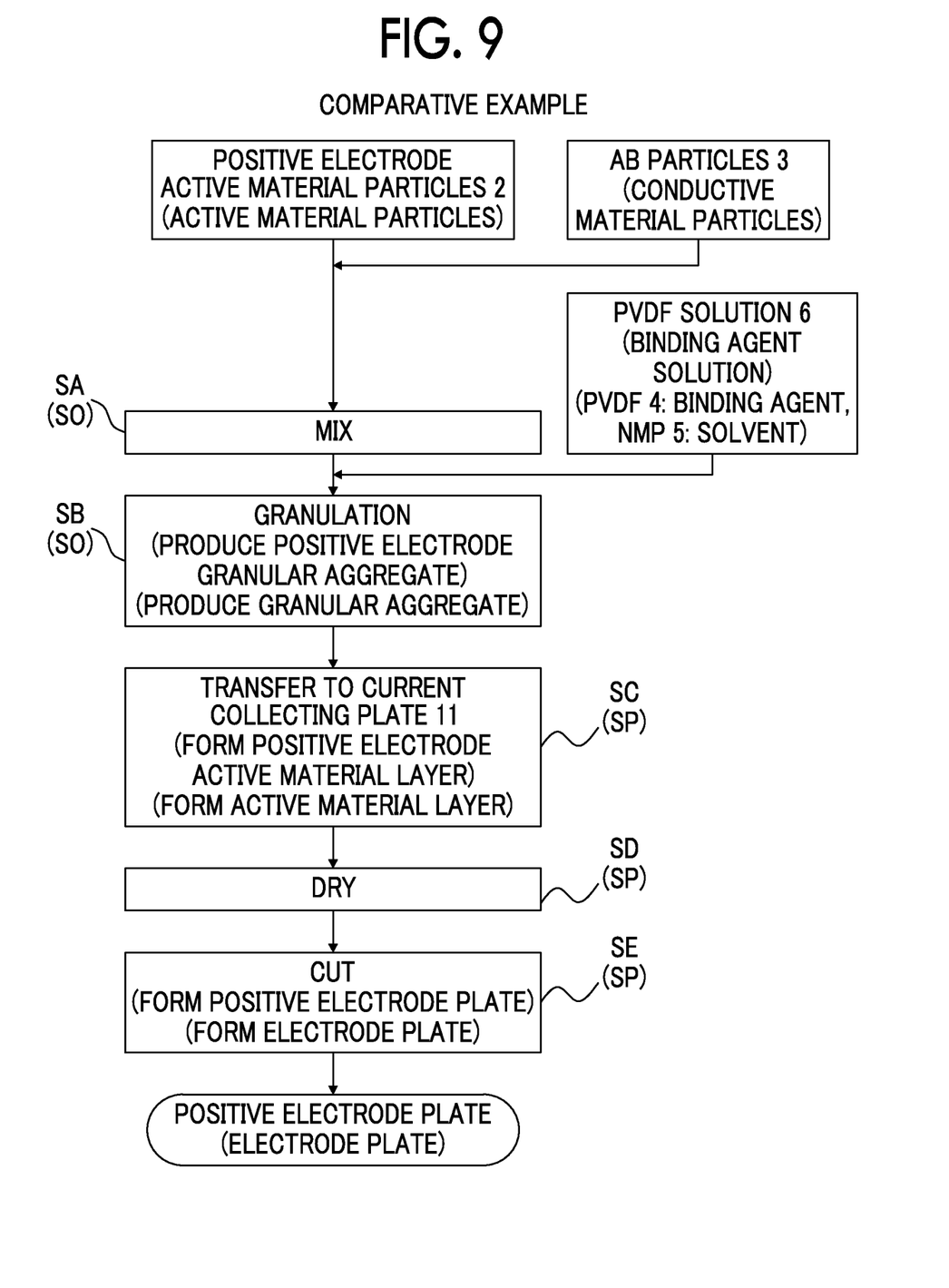
FIG. 9 is a flowchart showing procedures of producing a positive electrode granular aggregate and an electrode plate according to Comparative Examples 1 to 3.

On the other hand, as Comparative Examples 1 to 3, as shown in FIG. 9, positive electrode granular aggregates were produced according to a method different from that of the embodiment. Then, similarly, the positive electrode granular aggregate was transferred to a current collecting plate using the roll press device 250, and dried to produce a positive electrode plate. Specifically, first, the same positive electrode active material particles 2 and AB particles 3 as in the embodiment (example) were mixed in the dry state by rotating the stirring blades 243a and 243b of the stirring type mixing and granulating device 240 at a rotational speed of 4500 rpm for 20 seconds (mixing process: Step SA).

Next, as in the embodiment (example), the PVDF solution (binding agent solution) 6 in which PVDF (binding agent) 4 was dissolved in NMP (solvent) 5 was added to this mixture, and mixing and granulation were performed to produce a positive electrode granular aggregate (granulation process: Step SB). Specifically, the stirring blades 243a and 243b were rotated at a rotational speed of 800 rpm for 20 seconds, and a positive electrode granular aggregate in which positive electrode granulated substance were aggregated was obtained. Here, the solid fraction NV of the positive electrode granular aggregate was set to 80 wt % in Comparative Example 1, 78 wt % in Comparative Example 2, and 76 wt % in Comparative Example 3.

(Spreadability Evaluation)

Figure 7:
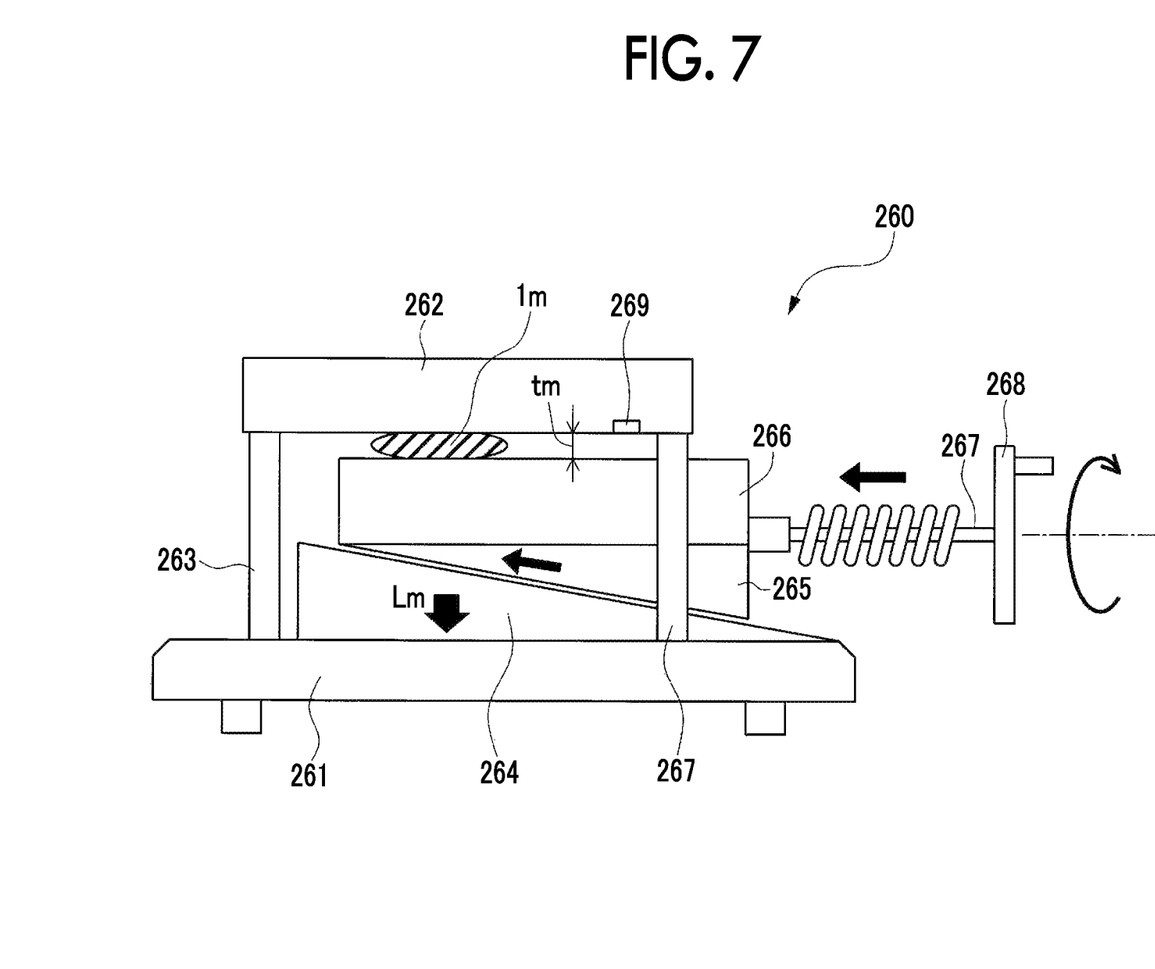
FIG. 7 is an explanatory diagram showing an overview of a spreadability measurement device configured to measure spreadability of a granular aggregate.

Spreadabilities of the positive electrode granular aggregates 1 according to Examples 1 to 3 and Comparative Examples 1 to 3 were evaluated using a spreadability evaluation device 260 shown in FIG. 7 as follows. First, the spreadability evaluation device (hereinafter simply referred to as an evaluation device) 260 will be described with reference to FIG. 7. An upper plate 262 was fixed above a stand including a load cell 261 within the evaluation device 260 with supports 263 and 263 therebetween. In addition, on the stand including a load cell 261, a lower wedge member 264 and an upper wedge member 265 each having a slope of a predetermined angle were stacked on top of each other while the above slopes faced each other. Further, a lower moving plate 266 was integrally disposed on the upper wedge member 265. Here, although details are not shown, when a rotation shaft 267 was rotated by a handle 268, the upper wedge member 265 and the lower moving plate 266 were moved to the left in the drawing using a moving mechanism, and since the upper wedge member 265 and the lower moving plate 266 moved along the slope of the lower wedge member 264, they also moved upward. That is, when the lower moving plate 266 moved to the left in the drawing by a predetermined distance, it also moved upward in the drawing by a predetermined height. Here, in the spreadability evaluation device 260 used in the example and the like, angles of slopes of the lower wedge member 264 and the upper wedge member 265 were set so that, when the lower moving plate 266 was moved 15 mm, lifting of 40 μm was performed upward.

When the aggregate 1 was evaluated, first, 0.5 g of the granular aggregate 1 was placed on the lower moving plate 266 of the evaluation device 260. Then, when the handle 268 was rotated, the lower moving plate 266 was moved to the left at a rate of 15 mm/sec and raised at a rate of 40 μm/sec. Thus, the aggregate 1 on the lower moving plate 266 was spread between the upper plate 262 and the lower moving plate 266 when a shear force was applied and formed a granulated substance film 1m.

During the spreading, a spread reaction force of the granulated substance film 1m was applied to the stand including a load cell 261 through the lower moving plate 266, the upper wedge member 265, and the lower wedge member 264 and measured as a load Lm. In addition, a displacement sensor 269 configured to measure a distance from the lower moving plate 266, and accordingly measure a granulated substance film thickness tm of the granulated substance film 1m was provided in the upper plate 262.

Figure 8:
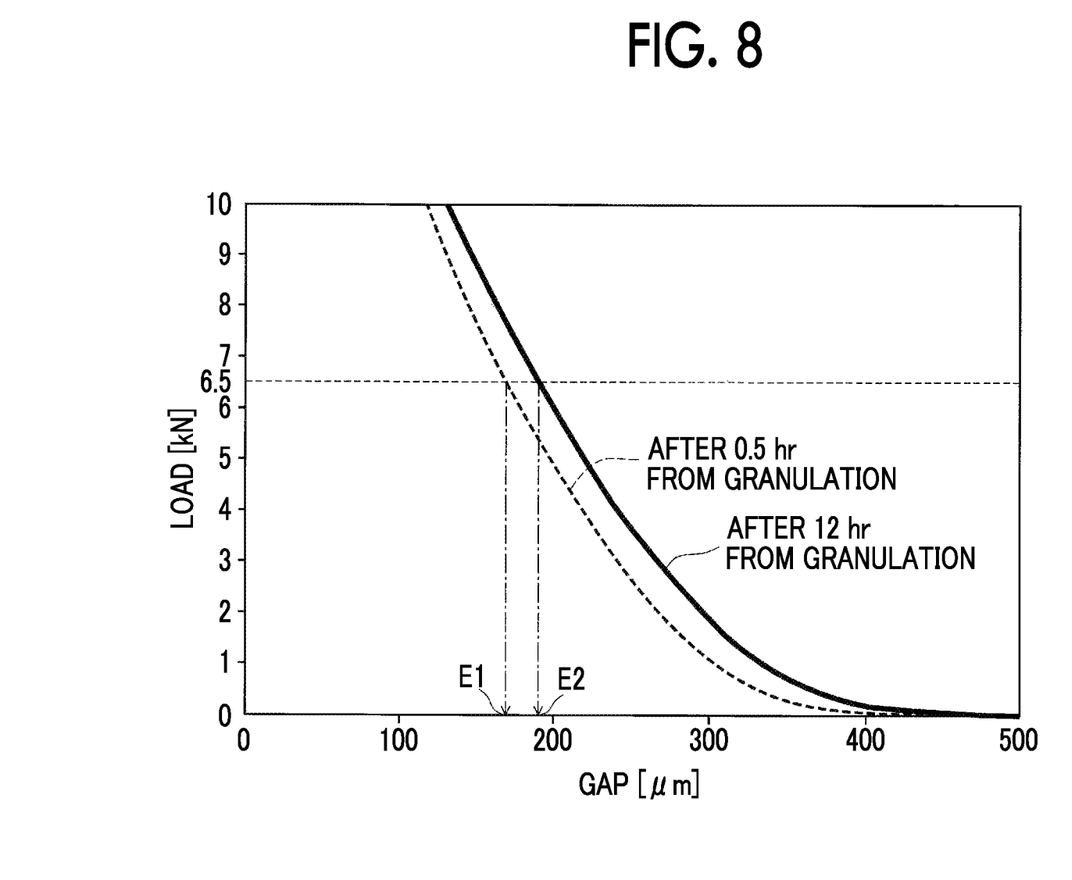
FIG. 8 is a graph showing an example of spreadability measurement data of a granular aggregate.

Therefore, FIG. 8 shows graphs of patterns of the relationship between the granulated substance film thickness tm (μm) and the load Lm (kN) of the aggregate 1 (the granulated substance film 1m). In the graph in FIG. 8, a granulated substance film thickness tm (μm) at which a predetermined load Lm was obtained was set as an evaluation value of spreadability. In the examples and comparative examples, a granulated substance film thickness tm (μm: @6.5 kN) at which a load Lm was 6.5 kN was set as an evaluation value of spreadability. Here, the graph shows that, when the spreadability evaluation value tm (@6.5 kN) is higher, the load Lm is higher before spreading advances, that is, spreadability of an aggregate is low (which is a positive electrode granular aggregate that hardly spreads).

Here, in FIG. 8, the graph indicated by a dashed line is a graph obtained when spreadability of the aggregate of Comparative Example 2 was evaluated as described above after 0.5 hours had elapsed from when the aggregate was produced (that is, granulated), and the spreadability evaluation value tm (@6.5 kN)=E1=162 μm was obtained. On the other hand, the graph indicated by a solid line shows the result obtained when spreadability of the same aggregate of Comparative Example 2 was measured after 12 hours had elapsed from when the aggregate was produced, and the spreadability evaluation value tm (@6.5 kN)=E2=195 μm was obtained.

As can been seen from the two graphs in FIG. 8, it can be understood that the aggregate of Comparative Example 2 had spreadability that greatly changed as time elapsed from when the aggregate was produced. Specifically, it shows that, as time elapses from when the aggregate is produced (granulated), spreadability is reduced, and the aggregate hardly spreads. Accordingly, it shows that, when such a granular aggregate is transferred to a current collecting plate using the roll press device 250, transfer becomes more difficult as time elapses from when the aggregate is produced, and it is more difficult to appropriately form the undried positive electrode active material layer 12x on the current collecting plate 11.

TABLE 1

| | Solid fraction NV (wt %) | Primary granulation | Spreadability evaluation value tm (μm) @6.5 kN | | Spreadability stability evaluation | Defect evaluation of active material layer | | Comprehensive evaluation |
|---|---|---|---|---|---|---|---|---|
| | | | After 0.5 hr | After 12 hr | | After 0.5 hr | After 12 hr | |
| Example 1 | 80 | Provided | 187 | 187 | Satisfactory | Satisfactory | Satisfactory | Satisfactory |
| Example 2 | 78 | Provided | 169 | 171 | Satisfactory | Satisfactory | Satisfactory | Satisfactory |
| Example 3 | 76 | Provided | 133 | 135 | Satisfactory | Satisfactory | Satisfactory | Satisfactory |
| Comparative Example 1 | 80 | Not provided | 182 | 216 | Defective | Satisfactory | Defective | Defective |
| Comparative Example 2 | 78 | Not provided | 162 | 195 | Defective | Satisfactory | Defective | Defective |
| Comparative Example 3 | 76 | Not provided | — | — | — | — | — | Defective |

Table 1 shows results obtained by measuring the spreadability evaluation value tm (@6.5 kN) of the aggregates 1 of Examples 1 to 3 and Comparative Examples 1 to 3 after 0.5 hours had elapsed and after 12 hours had elapsed from when the aggregates 1 were produced. Here, when the aggregate 1 was transferred to the current collecting plate 11 using the roll press device 250, a range of the spreadability evaluation value tm (@6.5 kN) required for the aggregate was tm≤190 μm. In addition, in Table 1, in a column of spreadability stability evaluation, when a difference Δtm between the spreadability evaluation values tm (@6.5 kN) after 0.5 hours had elapsed and after 12 hours had elapsed from when the aggregate was produced satisfied Δtm≤10 μm, this was evaluated as "satisfactory" and otherwise, this was evaluated as "defective."

It can be understood that, in the aggregates 1 of Examples 1 to 3, both after 0.5 hours had elapsed and after 12 hours had elapsed, the spreadability evaluation value tm (@6.5 kN) satisfied tm≤190 μm, and favorable spreadability was exhibited. Here, since Example 1 had a high solid fraction NV (80 wt %), it had a higher spreadability evaluation value tm than Examples 2 and 3. However, it can be understood that there was almost no change (Δtm=0 μm) in the spreadability evaluation values tm (@6.5 kN) between after 0.5 hours had elapsed and after 12 hours had elapsed. In addition, since Example 3 had a low solid fraction NV (76 wt %), it had a lower spreadability evaluation value tm than Examples 1 and 2 (spreadability was higher). Further, it can be understood that a change in the spreadability evaluation value tm (@6.5 kN) between after 0.5 hours had elapsed and after 12 hours had elapsed was very small (Δtm=2 μm). Furthermore, since Example 2 had an intermediate solid fraction NV (78 wt %), a spreadability evaluation value tm was also an intermediate value between Examples 1 and 3. In addition, as in Examples 1 and 3, it can be understood that a change in the spreadability evaluation value tm (@6.5 kN) between after 0.5 hours had elapsed and after 12 hours had elapsed was very small (Δtm=2 μm). In this manner, the aggregates 1 of Examples 1 to 3 had a favorable spreadability evaluation value tm (@6.5 kN) both after 0.5 hours had elapsed and after 12 hours had elapsed, and a change (difference Δtm) in the spreadability evaluation value tm (@6.5 kN) was small. That is, a change in spreadability over time was small and spreadability was stable.

On the other hand, it can be understood that Comparative Examples 1 and 2 both had a spreadability evaluation value tm (@6.5 kN) after 0.5 hours had elapsed which was tm≤190 μm and exhibited favorable spreadability. However, it can be understood that both had a spreadability evaluation value tm (@6.5 kN) after 12 hours had elapsed which was tm>190 μm, and had unfavorable spreadability. It can be understood that the difference Δtm was large such as the difference Δtm=34 μm (Comparative Example 1) and the difference Δtm=33 μm (Comparative Example 2), and a change in spreadability over time was large. When such aggregates of Comparative Examples 1 and 2 were used and transferred to form the undried positive electrode active material layer 12x, it was favorable immediately after granulation. However, as time elapsed from when the aggregate was produced, spreadability gradually reduced and defects such as cracks and streaks were more likely to occur.

Here, in Comparative Example 3, it was not possible to obtain an appropriate granular aggregate, and evaluation was not possible. This is because, since a solid fraction NV was too low (too much solvent was added), when stirring was performed using the stirring type mixing and granulating device 240, positive electrode active material particles and the like gathered into a large dumpling shape.

In the aggregates of Comparative Examples 1 and 2, the vicinity of the positive electrode active material particles 2 was surrounded by a plurality of small AB particles (conductive material particles) 3 according to drying and mixing (refer to Step SA in FIG. 9), and in the subsequent granulation process (Step SB), PVDF 4 was disposed therearound to entangle them. NMP 5 was sucked from PVDF 4 toward the positive electrode active material particles 2 through the AB particles 3. Thus, it is thought that, when time had elapsed after the granulation process (Step SB), between the positive electrode active material particles 2 surrounded by the AB particles 3, an amount of NMP 5 which was retained in PVDF 4 and contributed to lubrication was small, and the positive electrode active material particles 2 surrounded by the AB particles 3 rubbed against each other, and therefore, relative positions of the positive electrode active material particles 2 hardly changed, and spreadability of the aggregate greatly reduced over time.

On the other hand, in the aggregates 1 of Examples 1 to 3, as described in the embodiment, first, a PVDF solution (PVDF 4 and NMP 5) was mixed into the positive electrode active material particles 2 and granulation was performed (refer to Step S11 in FIG. 1). Therefore, in the primary granular aggregate 7, NMP 5 was absorbed into the positive electrode active material particles 2 earlier. Accordingly, since the positive electrode active material particles 2 completely absorbed NMP 5 earlier, there was no factor that changed a distribution of NMP 5 over time. In addition, in the primary granular aggregate 7, PVDF (binding agent) 4 having a long molecule and containing NMP 5 was disposed around the positive electrode active material particles 2 to entangle them. However, unlike a comparative example in which the AB particles 3 were adhered around the dried positive electrode active material particles 2, PVDF had a long molecule, and only covered a part around the positive electrode active material particles 2. Then, when the AB particles 3 were added, mixing was performed, and secondary granulation was performed (Step S12), the primary granular aggregate 7 (primary granulated substance) was cut and mixed using the stirring blades 243*a* and 243*b*, and secondary granulation was performed. Therefore, the vicinities of the positive electrode active material particles 2 were covered with PVDF 4 and the AB particles 3 in a patchy state. Thus, when the positive electrode granular aggregate 1 which was a secondary granulated substance was spread and the positive electrode active material particles 2 relatively moved, unlike a comparative example, slipping occurred in PVDF 4 (containing NMP 5 and no AB particles 3 inside with the positive electrode active material particles 2 therebetween) positioned just outside the positive electrode active material particles 2, favorable spreadability was obtained, and hardly any change over time was inferred to occur.

(Evaluation of Transferability)

Next, the aggregates 1 of Examples 1 to 3 and Comparative Examples 1 and 2 were transferred to the positive electrode current collecting plates 11 using the roll press device 250. Transferabilities of the aggregates 1 were evaluated using defects occurring in the formed undried positive electrode active material layer 12*x*. Specifically, the number of cracks and streaks that occurred in the undried positive electrode active material layers 12*x* of Examples 1 to 3 and Comparative Examples 1 and 2 was counted visually. Then, when the total number of cracks and streaks for each 100 m in the length of the positive electrode plate was 10 or less, the positive electrode plate was evaluated as "satisfactory" and when the total number was greater than 10, the positive electrode plate was evaluated as "defective."

Regarding the positive electrode plates 10 using the aggregates 1 of Examples 1 to 3, both after 0.5 hours had elapsed and after 12 hours had elapsed, the defect evaluation was "satisfactory." This is because spreadability of the aggregate 1 was favorable. On the other hand, regarding the aggregates of Comparative Examples 1 and 2, the defect evaluation after 0.5 hours had elapsed was "favorable" but the defect evaluation after 12 hours had elapsed was "defective." This is because spreadability of the aggregate was reduced due to a change over time, and the aggregate after 12 hours had elapsed was used, appropriate transfer was not possible, and many cracks and streaks occurred in the positive electrode active material layer.

(Comprehensive Evaluation)

Based on such evaluation results of spreadability and transferability, all of the aggregates 1 of Examples 1 to 3 were "satisfactory" as a comprehensive evaluation. On the other hand, all of the aggregates of Comparative Examples 1 to 3 were "defective" as a comprehensive evaluation.

As described in the embodiment, when the aggregates 1 of Examples 1 to 3 were produced, in the positive electrode granular aggregate 1 produced accordingly, NMP (solvent) 5 penetrated into the positive electrode active material particles 2 beforehand. Therefore, a change in spreadability over time after the production was small and a change in transferability over time was also small. Thus, if the positive electrode granular aggregate 1 produced according to the production method described in the embodiment was used, when the aggregate 1 was transferred to the positive electrode current collecting plate 11 to form the positive electrode plate 10, it was possible to stably form the undried positive electrode active material layer 12*x* on the positive electrode current collecting plate 11 without an influence from elapse of time from when the aggregate 1 was produced until it was transferred, and the occurrence of cracks and streaks described above was prevented.

In particular, in the production method of the present embodiment, as described above, as the positive electrode active material particles 2, porous positive electrode active material particles 2 into which NMP (solvent) 5 was likely to be absorbed were used. In the primary granulation process (Step S11), the porous positive electrode active material particles 2 and the PVDF solution 6 were mixed and granulation was performed. Therefore, NMP (solvent) 5 in the PVDF solution 6 was quickly absorbed into the porous positive electrode active material particles 2. A quickly stabilizing relationship can be established for NMP (solvent) 5 between the positive electrode active material particles 2 and PVDF 4. Thereafter, the AB particles 3 were added, and the positive electrode granular aggregate 1 was produced according to the secondary granulation (Step S12). Thus, due to absorption of the NMP (solvent) 5 into the porous positive electrode active material particles 2 over time, a change in spreadability of the positive electrode granular aggregate 1 over time was reduced, and it was possible to stably transfer the aggregate 1 to the current collecting plate 11 to form the undried positive electrode active material layer 12*x* and further the positive electrode active material layer 12.

In particular, in the present embodiment and Examples 1 to 3, porous positive electrode active material particles made of a lithium-containing positive electrode active material were used as the positive electrode active material particles 2, AB particles were used as the conductive material particles 3, PVDF was used as the binding agent 4, and NMP was used as the solvent 5. Thus, due to absorption of the NMP (solvent) 5 into the porous positive electrode active material particles 2 over time, a change in spreadability of the positive electrode granular aggregate 1 over time was reduced, and it was possible to stably transfer the aggregate 1 to the current collecting plate 11 to form the favorable positive electrode active material layer 12.

In addition, in the present embodiment and Examples 1 to 3, the positive electrode granular aggregate 1 described above was transferred to the current collecting plate 11 and dried, and the positive electrode plate 10 including the positive electrode active material layer 12 was produced. Thus, since a change in transferability of the aggregate 1 over time was reduced and elapse of time from when the aggregate 1 was produced until it was transferred had hardly any influence, the occurrence of defects such as cracks and streaks was prevented, and it was possible to stably form the undried positive electrode active material layer 12*x*. Therefore, it was possible to obtain the positive electrode plate 10 including the positive electrode active material layer 12 having uniform quality.

Further, in the production method shown in the present embodiment and Examples 1 to 3 described above, the positive electrode plate 10 including the positive electrode active material layer 12 obtained by transferring the positive electrode granular aggregate 1 described above to the current collecting plate 11 and performing drying was used. Therefore, it was possible to use the positive electrode plate 10 having stable characteristics and it was possible to obtain the battery 50 having stable characteristics.

It should be noted that, while the present disclosure has been described above with reference to the embodiment and Examples 1 to 3, the present disclosure is not limited to the embodiment and the like, and can be appropriately changed and applied without departing from the spirit and scope of the disclosure. For example, in the embodiment and the like, a case in which the positive electrode granular aggregate 1 using the positive electrode active material particles 2 and the positive electrode plate 10 including the positive electrode active material layer 12 were produced was exemplified. However, the present disclosure can be applied when a negative electrode granular aggregate using negative electrode active material particles and a negative electrode plate including a negative electrode active material layer using the same are produced.

What is claimed is:

1. A method of producing a granular aggregate in which wet granulated substances including active material particles, conductive material particles, a binding agent for binding the active material particles and the conductive material particles, and a solvent are aggregated, the method comprising:
   dissolving the binding agent in the solvent to obtain a binding agent solution;
   adding the binding agent solution to the active material particles having a solvent absorbing property,
   performing a primary granulation step of granulating the binding agent solution and the active material particles to obtain a wet primary granular aggregate in which wet primary granulated particulates are aggregated; and
   mixing the conductive material particles into the wet primary granular aggregate; and
   performing a secondary granulation step of granulating the conductive material particles and the wet primary granular aggregate to obtain a granulated granular aggregate,
   wherein a particle size of the granulated granular aggregate is several tens of μm to several mm, and
   a solid fraction in the granulated granular aggregate is 76.0 wt % to 80 wt %.

2. The method of producing a granular aggregate according to claim 1,
   wherein the active material particles are porous active material particles formed by aggregation of primary particles made of an active material.

3. The method of producing a granular aggregate according to claim 2,
   wherein the active material particles are porous positive electrode active material particles made of a lithium-containing positive electrode active material, the conductive material particles are acetylene black, the binding agent is polyvinylidene fluoride, and the solvent is N-methyl-2-pyrrolidone.

4. A method of producing an electrode plate including a current collecting plate and an active material layer, the method comprising:
   transferring the granular aggregate produced by the method according to claim 1 to the current collecting plate such that an undried active material layer is formed; and
   drying the formed undried active material layer.

5. A method of producing a battery, comprising:
   forming an electrode body including the electrode plate produced by the method according to claim 4;
   accommodating the electrode body in a battery container;
   injecting an electrolyte solution into the battery container; and
   sealing the battery container.

* * * * *